US008610612B2

(12) United States Patent
Keramat et al.

(10) Patent No.: US 8,610,612 B2
(45) Date of Patent: Dec. 17, 2013

(54) TREE STRUCTURED SUPPLY AND BIAS DISTRIBUTION LAYOUT

(75) Inventors: Mansour Keramat, Santa Clara, CA (US); Yuan-Ju Chao, Santa Clara, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 29 days.

(21) Appl. No.: 13/404,205

(22) Filed: Feb. 24, 2012

(65) Prior Publication Data

US 2013/0222167 A1   Aug. 29, 2013

(51) Int. Cl.
*H03M 1/66* (2006.01)
*H02J 1/10* (2006.01)

(52) U.S. Cl.
USPC .............................. 341/144; 307/43

(58) Field of Classification Search
USPC .......... 341/144, 140, 135, 136; 327/108, 530; 323/364; 307/43
See application file for complete search history.

(56) References Cited

U.S. PATENT DOCUMENTS

| 7,825,982 | B2* | 11/2010 | Takayanagi | 348/372 |
| 7,973,571 | B2* | 7/2011 | Sato et al. | 327/108 |
| 8,379,465 | B2* | 2/2013 | Clinton et al. | 365/189.11 |
| 2010/0280676 | A1* | 11/2010 | Pabon et al. | 700/295 |
| 2012/0187936 | A1* | 7/2012 | Myers | 323/364 |

* cited by examiner

*Primary Examiner* — Peguy Jean Pierre
(74) *Attorney, Agent, or Firm* — Heimlich Law, PC; Alan Heimlich, Esq.

(57) ABSTRACT

Systems and methods are disclosed for performing data conversion by matching current sources using a thin oxide device; and minimizing voltage stress on the thin oxide device during operation or power down.

18 Claims, 6 Drawing Sheets

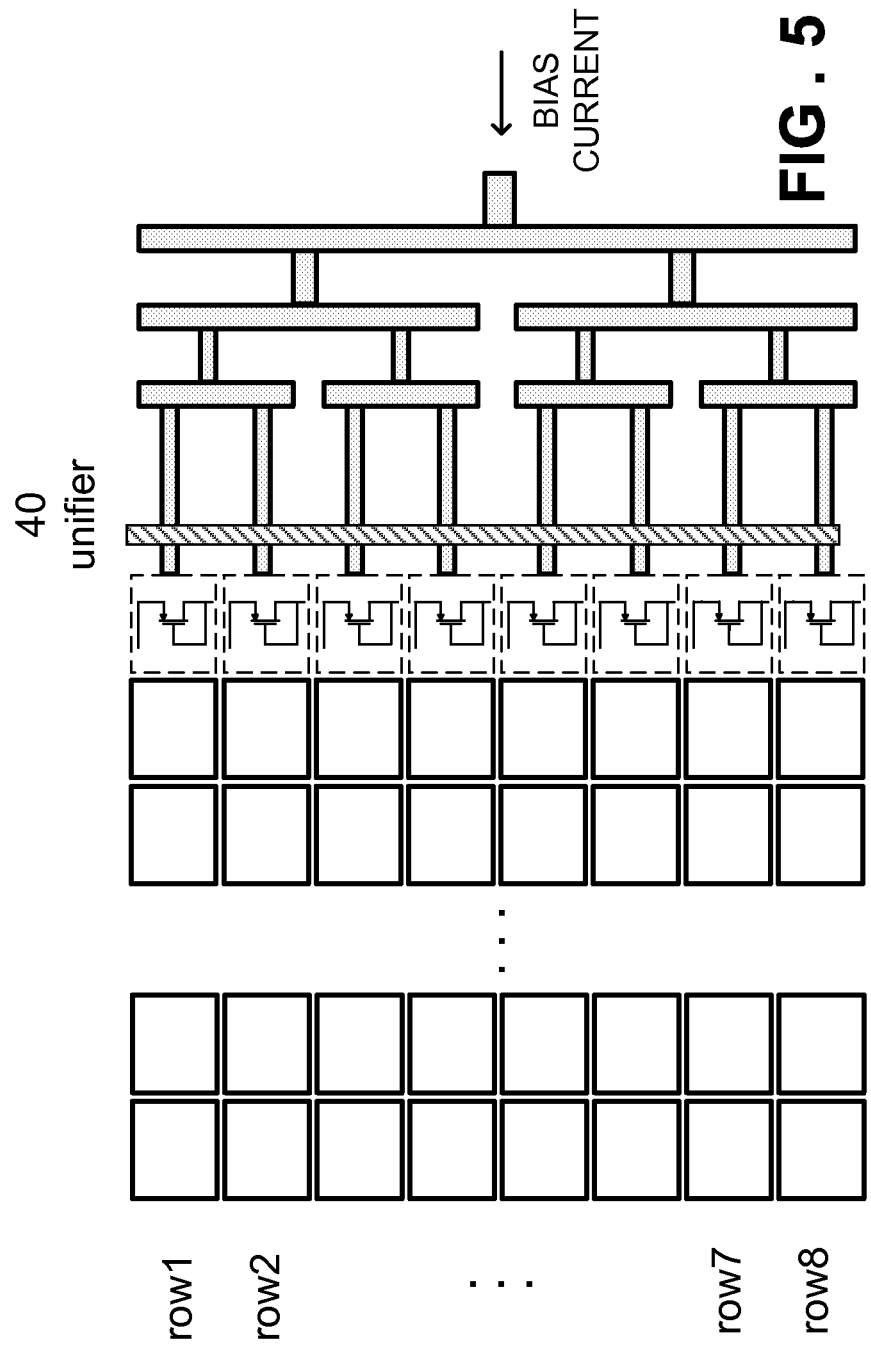

FIG. 6A (Prior Art) A. 10-bit Thermometer DAC
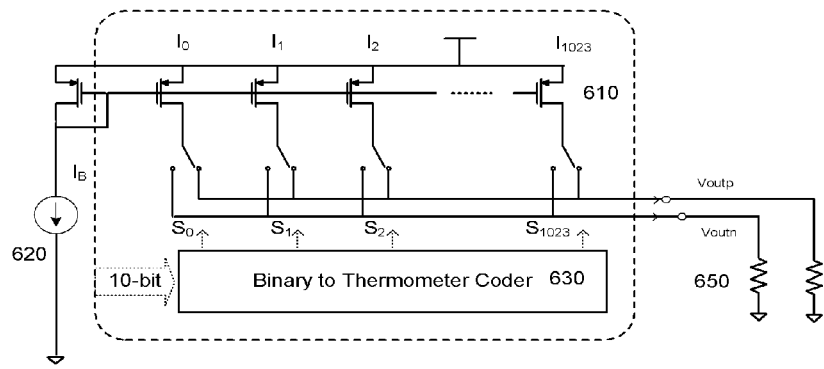
FIG. 6B (Prior Art) B. 10-bit Binary DAC
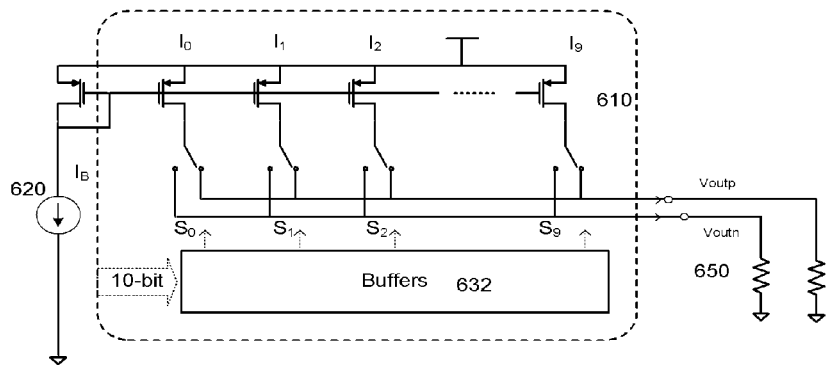
FIG. 6C (Prior Art) C. 10-bit 6+4 Segmented DAC
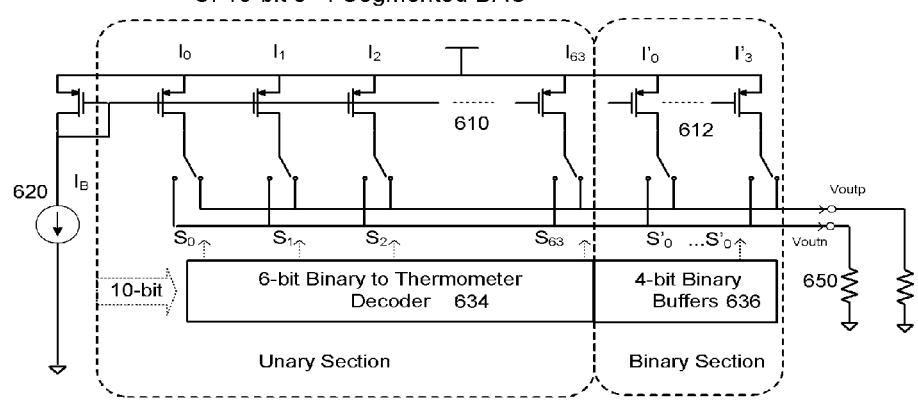

TREE STRUCTURED SUPPLY AND BIAS DISTRIBUTION LAYOUT

BACKGROUND

Current steering digital-to-analog converter (DAC) is widely used in modern analog and mixed-signal circuit system especially for high sampling rate applications. It consists of an array of current sources, the number of array depends on DAC's decoding scheme either thermometer, binary or segmented. The DAC linearity is mainly determined by the matching of the array of current sources.

When designing a high speed DAC many tradeoffs have to be taken into account. These include the type of the DAC (current steering or a voltage output DAC), the number of bits and required speed. For high speed DACs usually a current steering architecture is selected because of the speed advantages of this converter type with respect to the voltage output DAC. In most current steering DAC designs a combination of binary and thermometer code weighting is used. The thermometer code is used for the Most Significant Bits (MSBs), while binary code is used for the Least Significant Bits (LSBs). A combination of thermometer and binary codes is called segmentation: 0% segmentation means a fully binary converter and 100% segmentation means a full thermometer code converter. The DAC designer has to choose the optimum amount of segmentation and take into account the physical problems associated with the segmentation. Current steering DACs with a low amount of segmentation have the advantage of simplicity. They only need a few current sources and switches. The disadvantage of low segmentation is the possible larger DNL compared to the converter converters with larger segmentation. Converters with larger segmentation result in a lower DNL, but its larger area, more complex decoding scheme, and the difficulty to match the timing of different current sources bring other issues.

The basic principle of current steering DACs is the summation of currents according to the input. In a binary current steering converter, the current sources are connected parallel to each other. These current sources are connected to switches; the switches connect the current source to the output node. The switches are controlled by the input code of the DAC. The output current of the DAC is therefore proportional to the input code word. The output node of the DAC is connected to a resistor. This resistor converts the output current of the DAC into a voltage.

SUMMARY

In one aspect, a power supply distribution system for a data converter includes a power supply pad to receive power; a power bus coupled to the power supply pad; a multi-tiered tree structure set of power distribution lines coupled to the power bus to provide supply and bias power distribution in the data converter, wherein the tree structure includes at least a top tier set of power distribution trunks each supplying power to different bottom tier set of power connections; and an array of current sources having at least a row or a column powered by the bottom tier set of power connections.

In another aspect, a method for distributing power supply in a data converter includes fabricating a power bus coupled to a power supply pad to receive power; fabricating a multi-tiered tree structure set of power distribution lines and connecting a top tier to the power bus in the data converter; distributing power from the power us through a top tier set of power distribution trunks each supplying power to different bottom tier set of power connections; and powering an array of current sources having at least a row or a column powered by the bottom tier set of power connections.

Implementations of the above aspects can include one or more of the following. The system can include a second power bus coupled to the power supply pad; and a second multi-tiered tree structure set of power distribution lines coupled to the second power bus to provide supply and bias power distribution, wherein the second tree structure includes at least a top tier set of power distribution trunks each supplying power to different bottom tier set of power connections, and wherein the second multi-tiered tree structure feeds a row of the array of current sources while the first multi-tiered tree structure feeds a column of the array of current sources. The current cell can be a current source or a current sink. The current cell can be a cascoded source or double cascaded source. The current cell can be a cascoded sink or double cascaded sink. A diode can be connected to the array of current sources and the power supply pad. Bias voltages are generated by diode-connected devices and shared by all current source cells and wherein a bias distribution is from the diode. A plurality of diodes can be positioned between the array of current sources and the power supply pad. The bias voltages can be generated by diode-connected devices and shared by all current source cells and wherein a bias distribution is from multiple points from multiple diodes. A plurality power supply pads to receive power. A diode can be coupled to the array of current sources and the power supply pad and wherein a cell current $I_{cell}$ is defined as:

$$I_{cell} = \frac{1}{2} u_n C_{ox} \frac{W}{L} (VDDA - V_{BP1} - V_{TH})^2$$

where VDDA is a power supply voltage, VBP1 is a gate bias voltage, and VTH is a power transistor threshold voltage. The system can include a plurality of supply lines, wherein the supply lines for row (N) and row (N+1) are joined together to form a first master rail, with N being an odd number; and a second master rail coupled to a plurality of first master rails. Each row can have equal spacing and distance layout, and wherein a current cell in each row on one column has the same power (IR) drop from the power supply pad. A unifier can be connected to the power bus and a current steering digital to analog converter and wherein the unifier eliminates a second order effect of power (IR) drop. The set can have one multi-tiered tree structure for each of a supply voltage input, a bias voltage input, and a cascoded bias voltage input.

The preferred embodiments achieve better power and bias distribution to power current sources in a current steering DAC. This is achieved with a very small silicon area without suffering device stress and breakdown. Power received is clean and less noisy than conventional power supply approaches. As a result, the analog circuits on the chip can achieve much better resolution.

BRIEF DESCRIPTION OF THE DRAWINGS

An appreciation of the features and benefits of the present invention and a more complete understanding of its structure may be had by studying the following description of the preferred embodiment and by referring to the accompanying drawings.

FIG. 5 shows exemplary gate bias tree structure architecture for a current steering DAC.

FIGS. 6A-6C show typical current steering DACs in different Binary/Thermometer combination.

DESCRIPTION

The term "NFET" refers to an N-type metal oxide semiconductor field effect transistor. Likewise, when used herein, "PFET" refers to a P-type metal oxide semiconductor field effect transistor. It should be appreciated that whenever the terms, "NFET", "PFET", and "transistor," are used, unless otherwise expressly indicated or dictated by the nature of their use, they are being used in an exemplary manner. They encompass the different varieties of MOS devices including devices that don't literally use "metal", i.e., using another suitable material in place of metal such as polysilicon, and devices with different VTs and oxide thicknesses to mention just a few. Moreover, unless specifically referred to as MOS or the like, the term transistor can include other suitable transistor types, e.g., junction-field-effect transistors, bipolar junctiontransistors, and various types of multi-gated transistors, known today or not yet developed.

Figure 1:
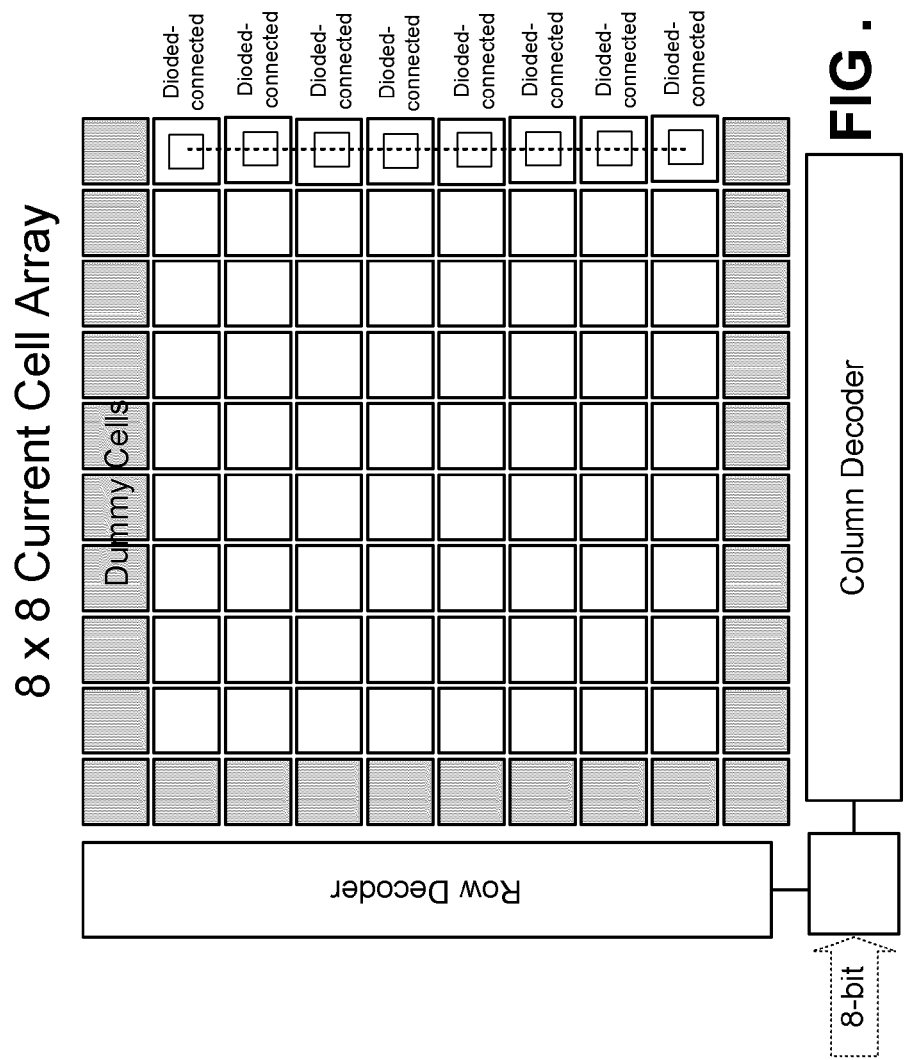
FIG. 1 shows a typical layout of 8 by 8 current source array for a current steering DAC.

FIG. 1 shows a typical current steering DAC layout with 8×8 current cell array. There are total 64 current cells with 8 columns and 8 rows. The first column on the right is the diode-connected column, which generates gate bias voltage for current source. Each current cell could be PFET current source or NFET current sink, while each of them can be cascoded to increase the output impedance of current source illustrated on FIGS. 2A-D.

Figure 2:
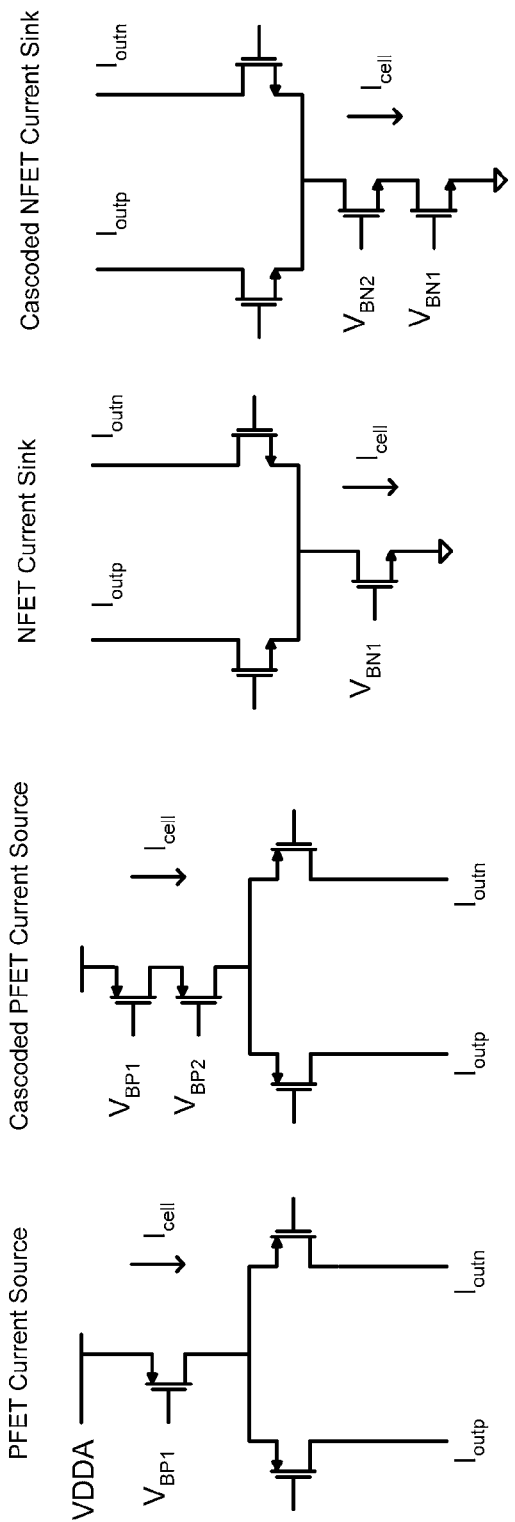
FIGS. 2A-2D show exemplary cascoded and non-cascoded current sources/sink for the current steering DAC.
Figure 3:
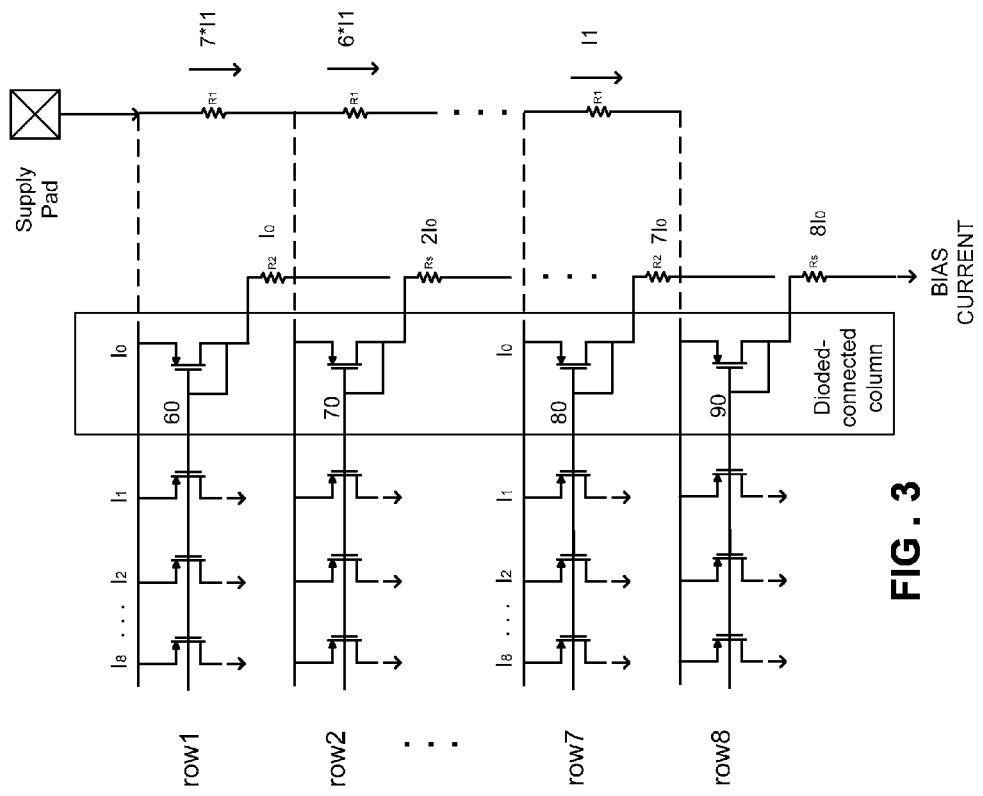
FIG. 3 shows the supply and gate bias current distribution of exemplary tree structure architecture for a current steering DAC.

The current amount of a current source like FIG. 2A is described as:

$$I_{cell} = \frac{1}{2} u_n C_{ox} \frac{W}{L} (VDDA - V_{BP1} - V_{TH})^2$$

Where VDDA is the power supply voltage, VBP1 is the gate bias voltage, and VTH is the PFET threshold voltage. Unless two separate current sources have equal supply voltage VDDA and gate bias voltage VBP1, the current amount will not be the same. Due to the wire resistance through distribution, both gate bias voltage and supply suffer from IR drop, which causes the current cells in each row have different gate bias voltage and power supply. Illustrated on FIG. 3 is an eight-row schematic, the supply voltage of the eighth row will be 7*I1*R1 lower than the supply voltage of first row due to supply routing resistance R1. Similarly, bias current distributed to eight rows suffer from the routing resistance as well. The current differences between rows degrade DAC linearity. Usually this systematic error is more problematic than the statistical/random error and it directly relates to the maximum INL. DAC maximum INL is an important specification and it also a good indication of DAC dynamic performance specification SFDR.

Figure 4:
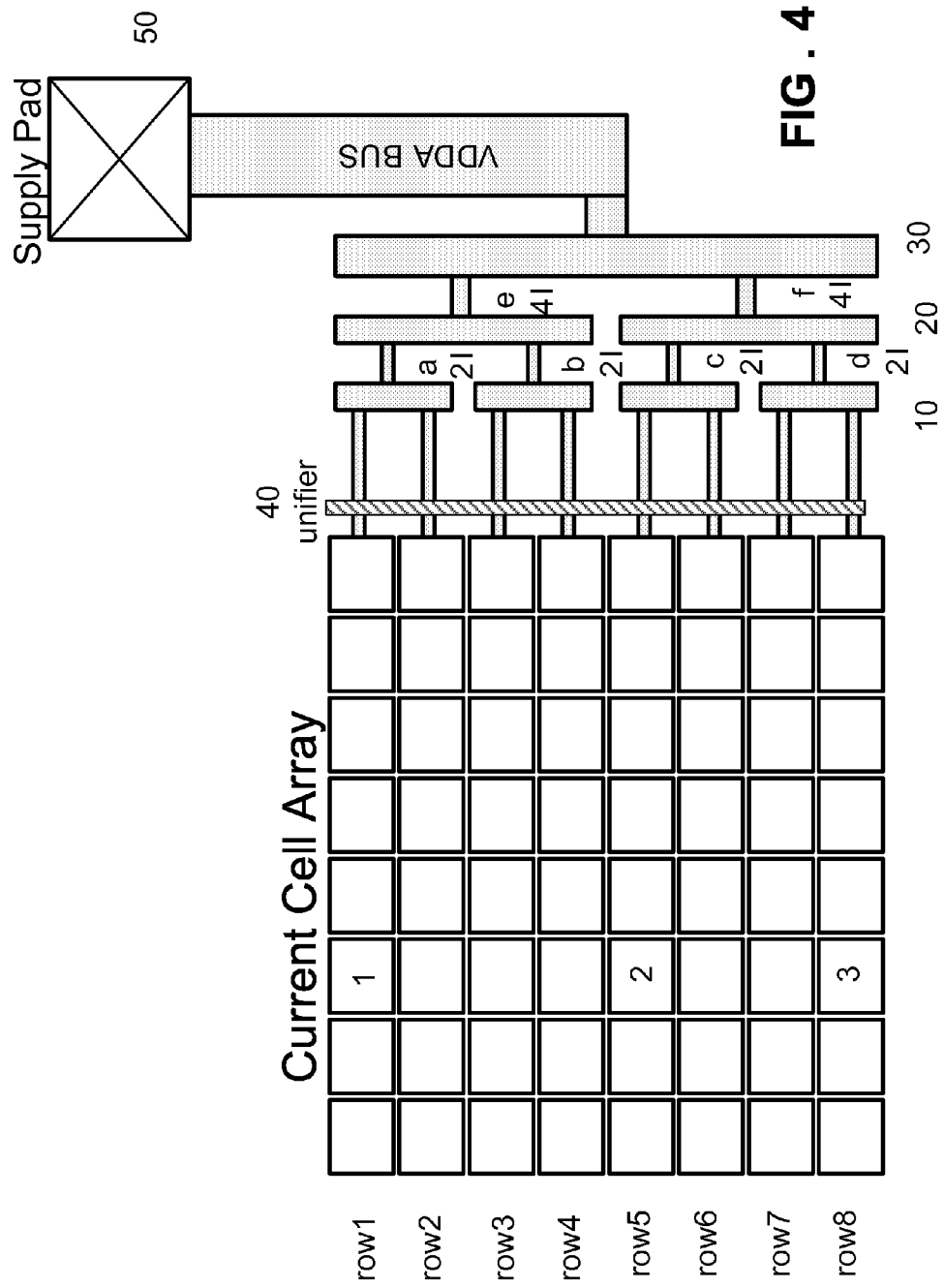
FIG. 4 shows exemplary supply tree structure architecture for a current steering DAC.

To eliminate the supply IR drop problem through wire distribution, FIG. 4 shows exemplary power tree structure with unifier architecture for a current steering DAC. A tree-structure layout on supply can mitigate the IR drop problem. In this example, the cell 1 on row1, cell 2 on rows and cell 3 on row8 will have the same IR drop with respect to a supply voltage on pad 50 with equally spacing tree structure layout. In this scheme, a main power rail 30 is connected to secondary power rails 20 where half of the current is delivered to each secondary power rail 20 from the main power rail 30. Similarly, each of the secondary power rails 20 is connected to tertiary power rails 10 where half of the supply current is delivered to each tertiary power rail 10 from the secondary power rail 20.

As shown in FIG. 4, the supply of row (N) and row (N+1) are jointed together first, with N=1, 3, 5 and 7. Then the four points a, b, c and d are jointed and become point e and f. Finally e and f are jointed and connected to VDDA from pad. With equal spacing and distance layout, it can be shown that the current cell in each row on the same column will have the same IR drop from the VDDA. FIG. 4 also shows the current distribution of the supply tree structure. The current needed for each row is I, the currents are summed as 2I at point a, b, c and d. Then the currents are summed again at point e and f to be 4I. Finally total 8I are connected to the pad. Note that the tree picks up row3 and row4 needs to be separated from the tree picking up row1 and row2 such that the row3 and row4 current goes through point c while row1 and row2 current goes through point d. The width and length of these tree structure branches depends on the current amount and tolerable IR drop. A thin wire metal 40 is used to connect the eight supply rails before the 8 supply rails reach current cell array. This wire "Unifier" will eliminate the second order effect of IR drop if there is still IR drop difference between 8 supply rails due to random physical layout mismatch.

As described earlier, the current amount of a current source is a function of a transistor's gate voltage with respect to supply rail. Thus, if the gate voltage of each row is different, the current amount will be different even though the supply IR drop issue is eliminated by the proposed supply tree structure. FIG. 3 also illustrates the bias voltage difference problem between the eight rows. The bias current comes from a bias circuitry and is fed into eight diode-connected PMOS transistors to create eight bias voltages for eight different rows. If the metal routing resistance Rs is zero, then the voltage at node 60, 70, 80 and 90 will have the same bias voltage with equal current distribution. However, the non-zero routing metal resistance Rs creates voltage IR drop and thus node 60, 70, 80 and 90 will have different bias voltage such that each row will have different current amount, which degrades DAC's linearity.

To solve this bias voltage difference problem, similarly the bias tree structure can be use to minimize the associated IR drop illustrated on FIG. 5. Bias current is fed into the tree structure then the current will be equally distributed to eight diode-connected transistors and creates equal voltages. A unifier 40 is added at the end of the tree structure to eliminate the second order effect of IR drop. As discussed above, the unifier 40 can be a thin wire metal used to connect the eight supply rails before the supply rails reach current cell array. This wire "unifier" will eliminate the second order effect of IR drop if there is still IR drop difference between 8 supply rails due to random physical layout mismatch.

To enhance the output impedance, the current source is usually cascoded as shown on FIG. 2B. In order to minimize the current difference between current cell array, the tree structure layout needs to be applied on supply voltage VDDA, bias voltage VBP1 and cascoded bias voltage VBP2.

FIGS. 6A-6C show exemplary current steering DACs. The data converter is a current steering digital to analog converter (DAC) which consists of an array of current sources shown in FIGS. 6A-6C.

Current steering digital-to-analog converter (DAC) is widely used in modern analog and mixed-signal circuit system especially for high sampling rate applications. It consists of an array of current sources, the number of array depends on DAC's decoding scheme either thermometer, binary or segmented. For N bit thermometer DAC, it consists of 2^N equal-weighted current cells. For N bit binary DAC, it consists of N binary-weighted current cells. For N+M segmented DAC, it has 2^N equal-weighted and M binary-weighted current cells. Take 10-bit DAC as an example, 10-bit thermometer DAC has 2^10=1024 current source; 10-bit binary DAC has 10 current sources; while 6+4 segmented DAC has 2^6=64 unary current sources and 4 binary current sources. FIGS. 6A-6C illustrate three exemplary DACs with different decoding schemes.

The currents are summed at the output and delivered to the output resistor load 650, whose value is predetermined for a 10-bit DAC in this example. The number of current sources depends on the architecture of thermometer, binary or segmented decoding schemes. Take an N-bit DAC as an example, thermometer DACs have 2^N equal current amount current sources. In this example, the controller 630 is a binary to thermometer coder for 10-bits of resolution. FIG. 6A shows an exemplary data converter using the current sources 610. The current sources 610 are connected to a current generator 620. A controller 630 controls the switches to generate the desired output voltage using resistive load 650.

Other DAC architecture can be used. For example, FIG. 6B shows a binary DAC with N current sources with binary weighted current amount. In this example, the buffers 632 controls the 10 switches connected to the 10 current sources 610 to generate the desired output voltage using resistive load 650.

Another architecture is a segmented DACs with the number of current source between 2^N to N depending on the ratio of thermometer and binary current sources. In this architecture, an exemplary 10-bit segmented DAC includes a 6-bit binary to thermometer decoder 634 driving 64 current sources 610, and a four-bit binary buffer 636 driving four current sources 612. The output is summed by the resistive load 650 as usual.

The tree-structure layout on bias voltage and supply mitigates this IR drop problem. FIG. 4 also shows the current distribution of the supply tree structure where the current needed for each row is I, the currents are summed as 2I at point a, b, c and d. Then the currents are summed again at point e and f to be 4I. Finally total 8I are connected to the pad. Note that the tree picks up row3 and row4 needs to be separated from the tree picking up row1 and row2 such that the row3 and row4 current goes through point c while row1 and row2 current goes through point d. The width and length of these tree structure branches depends on the current amount and tolerable IR drop. Similarly, the bias voltage can be distributed using a tree-structure to minimize the voltage difference between current cells in the current array.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the figures for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A power supply distribution system for a data converter, comprising:
a power supply pad to receive power;
a power bus coupled to the power supply pad;
a multi-tiered tree structure set of power distribution lines coupled to the power bus to provide supply and bias power distribution in the data converter, wherein the tree structure includes at least a top tier set of power distribution trunks each supplying power to different bottom tier set of power connections;
an array of current sources having at least a row or a column powered by the bottom tier set of power connections;
a second power bus coupled to the power supply pad; and
a second multi-tiered tree structure set of power distribution lines coupled to the second power bus to provide supply and bias power distribution, wherein the second tree structure includes at least a top tier set of power distribution trunks each supplying power to different bottom tier set of power connections, and wherein the second multi-tiered tree structure feeds a row of the array of current sources while the first multi-tiered tree structure feeds a column of the array of current sources.

2. The system of claim 1, wherein a current cell comprises a current source or a current sink.

3. The system of claim 1, wherein a current cell comprises a cascoded source or double cascaded source.

4. The system of claim 1, wherein a current cell comprises a cascoded sink or double cascaded sink.

5. The system of claim 1, comprising a diode coupled to the array of current sources and the power supply pad and wherein a cell current $I_{cell}$ is defined as:

$$I_{cell} = \frac{1}{2}u_n C_{ox} \frac{W}{L}(VDDA - V_{BP1} - V_{TH})^2$$

where VDDA is a power supply voltage, VBP1 is a gate bias voltage, and VTH is a power transistor threshold voltage.

6. The system of claim 1, comprising;
a plurality of supply lines, wherein the supply lines for row (N) and row (N+1) are joined together to form a first master rail, with N being an odd number; and
a second master rail coupled to a plurality of first master rails.

7. The system of claim 6, wherein each row comprises equal spacing and distance layout, and wherein a current cell in each row on one column has the same power (IR) drop from the power supply pad.

8. The system of claim 1, comprising a unifier coupled to the power bus and a current steering digital to analog converter and wherein the unifier eliminates a second order effect of power (IR) drop.

9. The system of claim 1, wherein the set comprises one multi-tiered tree structure for each of a supply voltage input, a bias voltage input, and a cascoded bias voltage input.

10. A method for distributing power supply in a data converter, comprising:
fabricating a power bus coupled to a power supply pad to receive power;
fabricating a multi-tiered tree structure set of power distribution lines and connecting a top tier to the power bus in the data converter;
distributing power from the power us through a top tier set of power distribution trunks each supplying power to different bottom tier set of power connections,
powering an array of current sources having at least a row or a column powered by the bottom tier set of power connections;
providing a second power bus coupled to the power supply pad;
fabricating a second multi-tiered tree structure set of power distribution lines coupled to the second power bus to provide supply and bias power distribution;
providing power to the first multi-tiered tree structure to supply a column of the array of current sources; and
providing power to the second multi-tiered tree structure to supply a row of the array of current sources.

11. The method of claim 10, wherein a current cell comprises a current source or a current sink.

12. The method of claim 10, wherein a current cell comprises a cascoded source or double cascaded source.

13. The method of claim 10, wherein a current cell comprises a cascoded sink or double cascaded sink.

14. The method of claim 10, comprising connecting a diode to the array of current sources and the power supply pad and wherein a cell current $I_{cell}$ is defined as:

$$I_{cell} = \frac{1}{2}u_n C_{ox} \frac{W}{L}(VDDA - V_{BP1} - V_{TH})^2$$

where VDDA is a power supply voltage, VBP1 is a gate bias voltage, and VTH is a power transistor threshold voltage.

15. The method of claim 10, comprising;
forming a plurality of supply lines, wherein the supply lines for row (N) and row (N+1) are joined together to form a first master rail, with N being an odd number; and
forming a second master rail coupled to a plurality of first master rails.

16. The method of claim 15, wherein each row comprises equal spacing and distance layout, and wherein a current cell in each row on one column has the same power (IR) drop from the power supply pad.

17. The method of claim 10, comprising forming a unifier coupled to the power bus and a current steering digital to analog converter and wherein the unifier eliminates a second order effect of power (IR) drop.

18. The system of claim 1, comprising forming one multi-tiered tree structure for each of a supply voltage input, a bias voltage input, and a cascoded bias voltage input.

* * * * *